United States Patent
Kim (10) Patent No.: US 9,654,105 B2
(45) Date of Patent: May 16, 2017

(54) ON-DIE TERMINATION ENABLE SIGNAL GENERATOR, SEMICONDUCTOR APPARATUS, AND SEMICONDUCTOR SYSTEM

(71) Applicant: SK hynix Inc., Icheon-si Gyeonggi-do (KR)

(72) Inventor: Kwang Hyun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/944,957

(22) Filed: Nov. 18, 2015

(65) Prior Publication Data
US 2017/0005657 A1    Jan. 5, 2017

(30) Foreign Application Priority Data

Jul. 3, 2015  (KR) .......................... 10-2015-0095297

(51) Int. Cl.
*H03K 19/00*    (2006.01)
*H03K 3/356*    (2006.01)

(52) U.S. Cl.
CPC ......... *H03K 19/0005* (2013.01); *H03K 3/356* (2013.01)

(58) Field of Classification Search
None
See application file for complete search history.

(56) References Cited

U.S. PATENT DOCUMENTS

| | | | | |
|---|---|---|---|---|
| 7,092,299 B2* | 8/2006 | Kwak | .................... | G11O 5/063 365/198 |
| 7,342,412 B2* | 3/2008 | Kim | ..................... | G11O 5/063 326/28 |
| 7,495,468 B2* | 2/2009 | You | .................... | H04L 25/0278 326/28 |
| 8,035,412 B2* | 10/2011 | Choo | ..................... | G11C 7/04 326/30 |
| 2003/0218477 A1* | 11/2003 | Jang | .................... | H04L 25/0298 326/30 |
| 2006/0158214 A1* | 7/2006 | Janzen | ................. | G11C 7/1051 326/30 |
| 2008/0042684 A1* | 2/2008 | Kim | .................. | H03K 19/0005 326/16 |
| 2008/0284465 A1* | 11/2008 | Kao | .................... | H04L 25/0278 326/30 |
| 2009/0267637 A1* | 10/2009 | Park | ....................... | G11C 29/02 326/16 |
| 2009/0309628 A1* | 12/2009 | Hyun | ................. | H03K 19/0005 326/30 |

(Continued)

FOREIGN PATENT DOCUMENTS

| | | |
|---|---|---|
| KR | 1020110096745 A | 8/2011 |
| KR | 1020140014709 A | 2/2014 |
| KR | 1020140055120 A | 5/2014 |

*Primary Examiner* — Crystal L Hammond
(74) *Attorney, Agent, or Firm* — William Park & Associates Ltd.

(57) ABSTRACT

A semiconductor apparatus may include an on-die termination (ODT) enable signal generator configured to enable an ODT enable signal in response to a data strobe signal, or enable the ODT enable signal in response to a command latch enable signal and an address latch enable signal. The semiconductor apparatus may include an ODT circuit configured to perform an ODT operation in response to the ODT enable signal.

16 Claims, 5 Drawing Sheets

(56) References Cited

U.S. PATENT DOCUMENTS

| | | | |
|---|---|---|---|
| 2011/0193590 A1* | 8/2011 | Nakagawa | G11C 7/1051 |
| | | | 326/30 |
| 2012/0113733 A1* | 5/2012 | Kim | G11O 5/063 |
| | | | 365/193 |
| 2013/0082758 A1* | 4/2013 | Dono | H03K 19/0005 |
| | | | 327/333 |

* cited by examiner

ON-DIE TERMINATION ENABLE SIGNAL GENERATOR, SEMICONDUCTOR APPARATUS, AND SEMICONDUCTOR SYSTEM

CROSS-REFERENCES TO RELATED APPLICATION

This application claims priority under 35 U.S.C. 119(a) to Korean application No. 10-2015-0095297, filed on Jul. 3, 2015, in the Korean intellectual property Office, which is incorporated by reference in its entirety as set forth in full.

BACKGROUND

1. Technical Field

Various embodiments generally relate to a semiconductor integrated circuit, and more particularly, to an on-die termination enable signal generator, a semiconductor apparatus, and a semiconductor system.

2. Related Art

Semiconductor apparatuses prevent distortion of input/output (I/O) signals through impedance matching with external apparatuses.

The circuit for performing the impedance matching is an on-die termination (ODT) circuit.

The semiconductor apparatuses receive data without distortion through the ODT circuit and store the received data when the semiconductor apparatuses receive data from the outside.

The semiconductor apparatuses may be mass-produced as products and may go through a lot of tests. However, for the semiconductor apparatuses where the ODT circuit is operated only when data is input, its bothersome to have to operate the ODT circuit by having to input data for the tests. Further, since the data is not input and thus the ODT circuit does not operate for the test, it is difficult to verify the ODT circuit.

SUMMARY

According to an embodiment, there may be provided a semiconductor apparatus. The semiconductor apparatus may include an on-die termination (ODT) enable signal generator configured to enable an ODT enable signal in response to a data strobe signal, or enable the ODT enable signal in response to a command latch enable signal and an address latch enable signal. The semiconductor apparatus may include an ODT circuit configured to perform an ODT operation in response to the ODT enable signal.

According to an embodiment, there may be provided a semiconductor apparatus. The semiconductor apparatus may include an activation determination unit configured to generate an activation determination signal in response to a command. The semiconductor apparatus may include a set signal generator configured to, in response to a test signal, generate a set signal according to a data strobe signal or generate the set signal according to a command latch enable signal and an address latch enable signal. The semiconductor apparatus may include a reset signal generator configured to generate a reset signal in response to a chip enable signal, the command latch enable signal, and the address latch enable signal. The semiconductor apparatus may include an enable signal generator configured to generate an on-die termination (ODT) enable signal in response to the activation determination signal, the set signal, and the reset signal. The semiconductor apparatus may include an ODT circuit configured to perform an ODT operation in response to the ODT enable signal.

According to an embodiment, there may be provided a semiconductor system. The semiconductor system may include an external apparatus. The semiconductor system may include a semiconductor apparatus coupled to the external apparatus through a plurality of input/output (I/O) signal lines and a plurality of control signal lines. The plurality of control signal lines may be signal lines for transferring a command latch enable signal, an address latch enable signal, a data strobe signal, and a mode control signal, and the plurality of input/output (I/O) signal lines may be signal lines for transferring an address, a command, and data. The semiconductor apparatus may, in response to the mode control signal, perform an on-die termination (ODT) operation according to the data strobe signal or perform the ODT operation according to the command latch enable signal and the address latch enable signal.

According to an embodiment, there may be provided a semiconductor apparatus. The semiconductor apparatus may include an on-die termination (ODT) circuit and an ODT enable signal generator coupled to the ODT circuit. The ODT circuit may be configured to perform an ODT operation in response to a command latch enable signal and an address latch enable signal, or in response to a data strobe signal.

According to an embodiment, there may be provided an on-die termination (ODT) enable signal generator. The ODT enable signal generator may include a set signal generator configured to receive a data strobe signal, command latch enable signal, and an address latch enable signal. The ODT enable signal generator may include an enable signal generator coupled to the set signal generator and may be configured to output an ODT enable signal for activating a performance of an ODT operation in response to a data strobe signal, or in response to a command latch enable signal and an address latch enable signal.

DETAILED DESCRIPTION

Hereinafter, examples of embodiments will be described below with reference to the accompanying drawings. Examples of the embodiments are described herein with reference to cross-sectional illustrations that are schematic illustrations of the examples of the embodiments (and intermediate structures). As such, variations from the shapes of the illustrations as a result, for example, of manufacturing techniques and/or tolerances, are to be expected. Thus, examples of the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The concepts are described herein with reference to cross-section and/or plan illustrations that are schematic illustrations of examples of embodiments. However, the embodiments are not be limited to the illustrated embodiments. Although a few embodiments will be illustrated and described, it will be appreciated by those of ordinary skill in the art that changes may be made in these examples of the embodiments without departing from the principles and spirit of the disclosure.

A semiconductor apparatus in an embodiment may have a characteristic whereby a method of activating an on-die termination (ODT) operation may be changed according to an operation mode. Hereinafter, embodiments will be described by using an example of a test mode (in a test) and a normal mode (in a non-test) as the operation mode, but the operation mode is not limited thereto.

Figure 1:
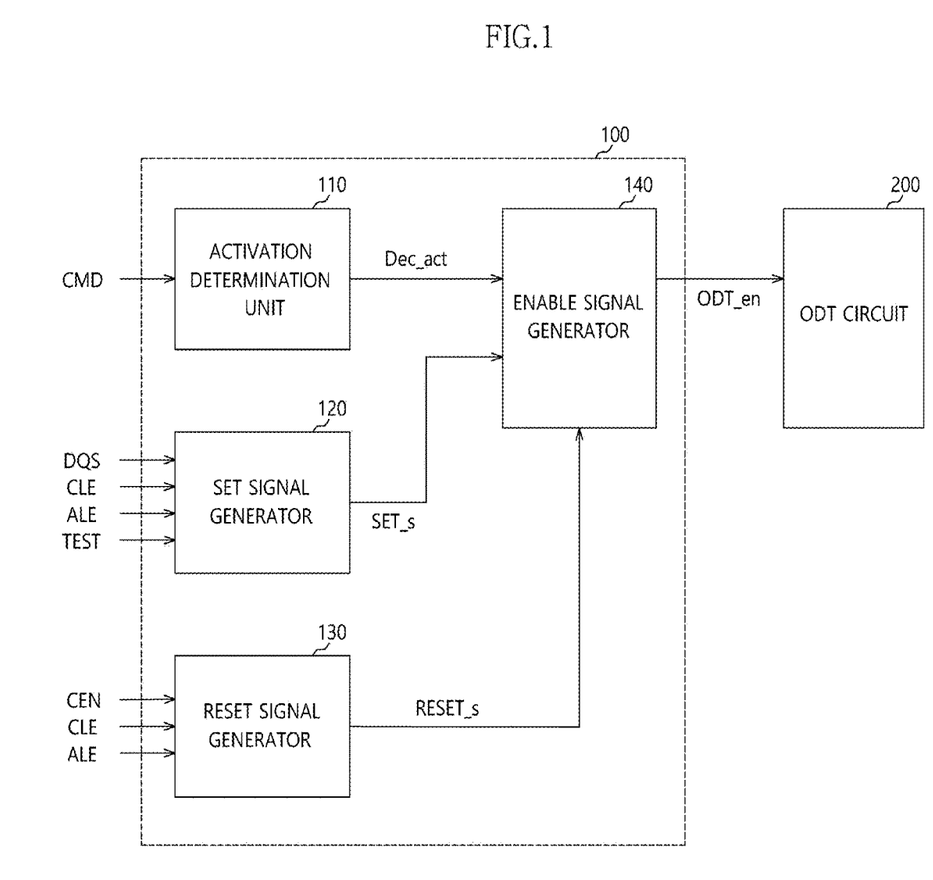
FIG. 1 is a diagram illustrating a representation of an example of a configuration of a semiconductor apparatus according to an embodiment.

Referring to FIG. 1, the semiconductor apparatus according to an embodiment may include an ODT enable signal generator 100 and an ODT circuit 200.

The ODT enable signal generator 100 may generate an ODT enable signal ODT_en in response to a command CMD, a data strobe signal DQS, a command latch enable signal CLE, an address latch enable signal ALE, a chip enable signal CEN, and a test signal TEST. For example, the ODT enable signal generator 100 may determine whether or not to perform the ODT operation in response to the command CMD. The ODT enable signal generator 100 may enable the ODT enable signal ODT_en in response to the test signal TEST, the command latch enable signal CLE, the address latch enable signal ALE, and the data strobe signal DQS. The ODT enable signal generator 100 may disable the ODT enable signal ODT_en in response to the chip enable signal CEN, the command latch enable signal CLE, and the address latch enable signal ALE. The command latch enable signal CLE may be a signal notifying the semiconductor apparatus that a signal input to the semiconductor apparatus is a command. The address latch enable signal ALE may be a signal notifying the semiconductor apparatus that a signal input to the semiconductor apparatus is an address. The data strobe signal DQS may be a signal notifying the semiconductor apparatus that a signal input to the semiconductor apparatus is data. The chip enable signal CEN may be a signal notifying the semiconductor apparatus that a chip is enabled. Accordingly, when a signal is input to the semiconductor apparatus in a state that the command latch enable signal CLE is enabled, the semiconductor apparatus may recognize the input signal as a command. When a signal is input to the semiconductor apparatus in a state that the address latch enable signal ALE is enabled, the semiconductor apparatus may recognize the input signal as an address.

The ODT circuit 200 may perform the ODT operation in response to the ODT enable signal ODT_en. For example, the ODT circuit 200 may perform the ODT operation during an enable period of the ODT enable signal ODT_en.

Referring to FIG. 1, the ODT enable signal generator 100 may include an activation determination unit 110, a set signal generator 120, a reset signal generator 130, and an enable signal generator 140.

The activation determination unit 110 may generate an activation determination signal Dec_act in response to the command CMD. For example, the activation determination unit 110 may enable the activation determination signal Dec_act when the command CMD is a command for operating the ODT circuit 200.

The set signal generator 120 may generate a set signal SET_s in response to the test signal TEST, the data strobe signal DQS, the command latch enable signal CLE, and the address latch enable signal ALE. The set signal generator 120 may generate the set signal SET_s in response to the data strobe signal DQS when the test signal TEST is disabled, and generate the set signal SET_s in response to the command latch enable signal CLE and the address latch enable signal ALE when the test signal TEST is enabled. For example, the set signal generator 120 may output the data strobe signal DQS as the set signal SET_s when the test signal TEST is disabled. When both the command latch enable signal CLE and the address latch enable signal ALE are disabled in a state that the test signal TEST is enabled, the set signal generator 120 may generate a pulse (not illustrated), and output the generated pulse as the set signal SET_s.

The reset signal generator 130 may generate a reset signal RESET_s in response to the chip enable signal CEN, the command latch enable signal CLE, and the address latch enable signal ALE. For example, when the chip enable signal CEN is disabled and both the command latch enable signal CLE and the address latch enable signal ALE are enabled, the reset signal generator 130 may generate a pulse (not illustrated), and output the generated pulse as the reset signal RESET_s.

The enable signal generator 140 may generate the ODT enable signal ODT_en in response to the activation determination signal Dec_act, the set signal SET_s, and the reset signal RESET_s. For example, when the activation determination signal Dec_act is enabled and the set signal SET_s is enabled, the enable signal generator 140 may enable the ODT enable signal ODT_en, and until the reset signal RESET_s is enabled, the enable signal generator 140 may maintain the enable state of the ODT enable signal ODT_en. For example, when the set signal SET_s is enabled in a state that the activation determination signal Dec_act is enabled, the enable signal generator 140 may enable the ODT enable signal ODT_en, and when the reset signal RESET_s is enabled, the enable signal generator 140 may disable the ODT enable signal ODT_en which has been enabled.

Figure 2:
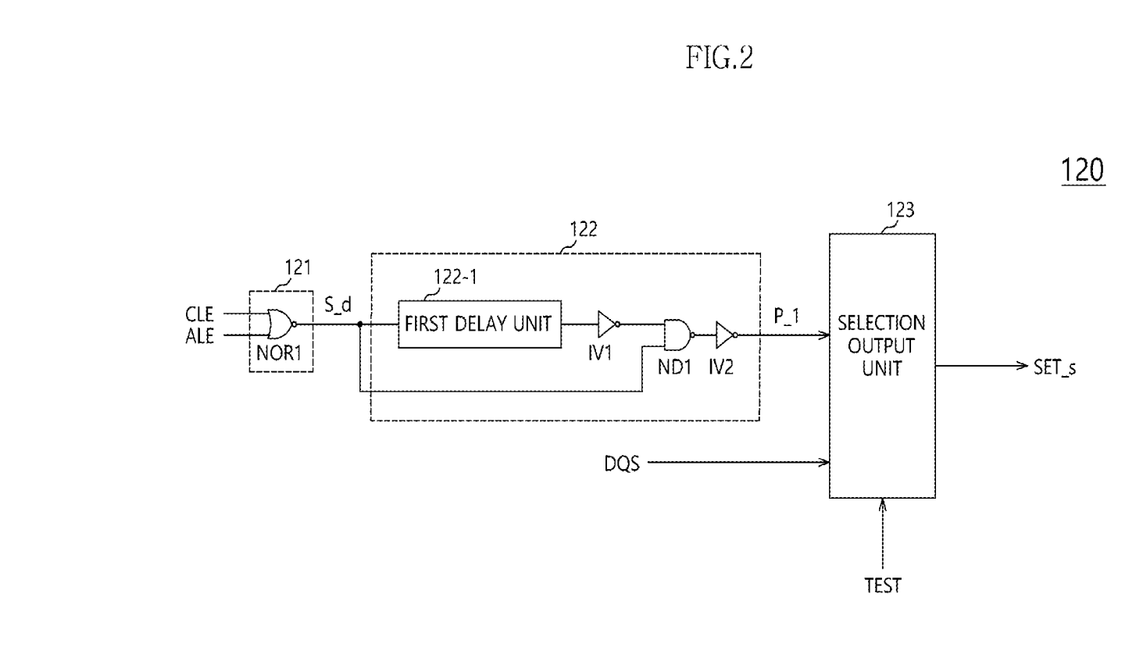
FIG. 2 is a diagram illustrating a representation of an example of a configuration of a set signal generator of FIG. 1.

Referring to FIG. 2, the set signal generator 120 may include a set signal enable determination unit 121, a first pulse generator 122, and a selection output unit 123.

The set signal enable determination unit 121 may generate a set determination signal S_d in response to the command latch enable signal CLE and the address latch enable signal ALE. For example, the set signal enable determination unit 121 may enable the set determination signal S_d when both the command latch enable signal CLE and the address latch enable signal ALE are disabled.

The set signal enable determination unit 121 may include a logic gate. For example, the set signal enable determination unit 121 may include a NOR gate NOR1, but is not limited in this manner. The NOR gate NOR1 may output the set determination signal S_d by receiving the command latch enable signal CLE and the address latch enable signal ALE.

The first pulse generator 122 may generate a first pulse P_1 enabled for a preset time in response to the set determination signal S_d. For example, the first pulse generator 122 may generate the first pulse P_1 enabled for the preset time when the set determination signal S_d is enabled.

The first pulse generator 122 may include a first delay unit 122-1, first and second inverters IV1 and IV2, and a first NAND gate ND1. The first delay unit 122-1 may receive the set determination signal S_d. The first inverter IV1 may receive an output signal of the first delay unit 122-1. The first NAND gate ND1 may receive an output signal of the first inverter IV1 and the set determination signal S_d. The second inverter IV2 may output the first pulse P_1 by receiving an output signal of the first NAND gate ND1.

The selection output unit 123 may output one of either the first pulse P_1 or the data strobe signal DQS as the set signal SET_S in response to the test signal TEST. For example, the selection output unit 123 may output the first pulse P_1 as the set signal SET_s when the test signal is enabled, and the selection output unit 123 may output the data strobe signal DQS as the set signal SET_s when the test signal TEST is disabled. The selection output unit 123 may be implemented with a multiplexer.

Figure 3:
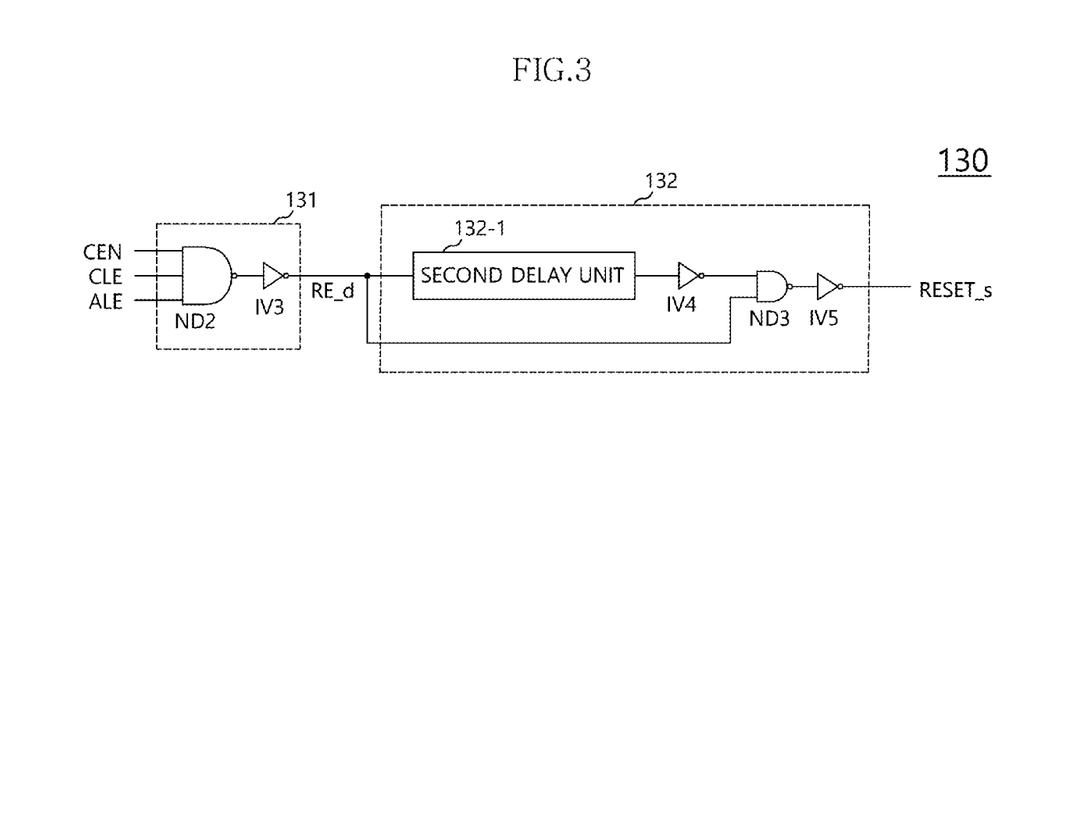
FIG. 3 is a diagram illustrating a representation of an example of a configuration of a reset signal generator of FIG. 1.

Referring to FIG. 3, the reset signal generator 130 may include a reset signal enable determination unit 131 and a second pulse generator 132.

The reset signal enable determination unit 131 may generate a reset determination signal RE_d in response to the chip enable signal CEN, the command latch enable signal CLE, and the address latch enable signal ALE. For example, the reset signal enable determination unit 131 may enable the reset determination signal RE_d when the chip enable signal CEN is disabled and both the command latch enable signal CLE and the address latch enable signal ALE are enabled.

The reset signal enable determination unit 131 may include a logic gate, for example but not limited to, a second NAND gate ND2 and a third inverter IV3. The second NAND gate ND2 may receive the chip enable signal CEN, the command latch enable signal CLE, and the address latch enable signal ALE. The third inverter IV3 may output the reset determination signal RE_d by receiving an output signal of the second NAND gate ND2.

The second pulse generator 132 may generate a pulse enabled for a preset time when the reset determination signal RE_d is enabled, and output the generated pulse as the reset signal RESET_s. For example, the second pulse generator 132 may generate the reset signal RESET_s enabled for a preset time when the reset determination signal RE_d is enabled.

The second pulse generator 132 may include a second delay unit 132-1, fourth and fifth inverters IV4 and IV5, and a third NAND gate ND3. The second delay unit 132-1 may receive the reset determination signal RE_d. The fourth inverter IV4 may receive an output signal of the second delay unit 132-1. The third NAND gate ND3 may receive an output signal of the fourth inverter IV4 and the reset determination signal RE_d. The fifth inverter IV5 may output the reset signal RESET_s by receiving an output signal of the third NAND gate ND3.

The operation of the semiconductor apparatus having an above-described configuration will be described below.

First, the operation of a semiconductor apparatus in a non-test will be described.

Referring to FIG. 1, the activation determination unit 110 may enable the activation determination signal Dec_act in response to the command CMD when the command CMD is a command for activating the ODT circuit 200.

Referring to FIG. 2, the set signal generator 120 may output the data strobe signal DQS as the set signal SET_s when the test signal TEST is disabled. The test signal TEST is a signal which is enabled only in a test and disabled in a non-test. The selection output unit 123 of the set signal generator 120 may output the data strobe signal DQS as the set signal SET_s when the test signal TEST is disabled.

Referring to FIG. 1, the enable signal generator 140 may enable the ODT enable signal ODT_en when the set signal SET_s is enabled in a state that the activation determination signal Dec_act is enabled. The enable signal generator 140 may maintain the enable state of the ODT enable signal ODT_en until the reset signal RESET_s is enabled.

Referring to FIG. 3, the reset signal generator 130 may enable the reset signal RESET_s for a preset time when the chip enable signal CEN is disabled and both the command latch enable signal CLE and the address latch enable signal ALE are enabled. For example, the reset signal enable determination unit 131 of the reset signal generator 130 may enable the reset determination signal RE_d to a high level when the chip enable signal CEN is disabled to the high level and the command latch enable signal CLE and the address latch enable signal ALE are enabled to the high level. The second pulse generator 132 of the reset signal generator 130 may generate a pulse enabled for a preset time when the reset determination signal RE_d is enabled to the high level, and output the generated pulse as the reset signal RESET_s. Accordingly, the reset signal RESET_s may be enabled for the preset time when the chip enable signal CEN is disabled and both the command latch enable signal CLE and the address latch enable signal ALE are enabled.

Referring to FIG. 1, the enable signal generator 140 may disable the ODT enable signal ODT_en which has been maintained in the enable state when the reset signal RESET_s is enabled.

The ODT circuit 200 may perform an ODT operation in an enable period of the ODT enable signal ODT_en.

Accordingly, in the semiconductor apparatus according to an embodiment, when the command CMD is determined as a command for activating the ODT circuit 200 in a non-test, the ODT circuit 200 may perform the ODT operation in response to the data strobe signal DQS. When the chip enable signal CEN is disabled and the command latch enable signal CLE and the address latch enable signal ALE are enabled, the ODT operation of the ODT circuit 200 may be interrupted.

The operation of the semiconductor apparatus while in a test will be described.

In a test, the test signal TEST is enabled.

Referring to FIG. 1, the activation determination unit 110 may enable the activation determination signal Dec_act in response to the command CMD when the command CMD is a command for activating the ODT circuit 200.

Referring to FIG. 2, the set signal generator 120 may output the first pulse P_1 as the set signal SET_s when the test signal TEST is enabled. The operation of generating the pulse signal P_1 through the set signal generator 120 will be described. The set signal enable determination unit 121 may enable the set determination signal S_d, which is enabled to the high level when both the command latch enable signal CLE and the address latch enable signal ALE are disabled to a low level, to the high level. The first pulse generator 122 may generate the first pulse P_1 which is enabled for a preset time when the set determination signal S_d is enabled to the high level. The selection output unit 123 may output the first pulse P_1 as the set signal SET_s when the test signal TEST is enabled.

The set signal generator 120 may generate the set signal SET_s in response to the command latch enable signal CLE and the address latch enable signal ALE in a test.

Referring to FIG. 1, the enable signal generator 140 may enable the ODT enable signal ODT_en when the set signal SET_s is enabled in a state that the activation determination signal Dec_act is enabled. The enable signal generator 140 may maintain the enable state of the ODT enable signal ODT_en until the reset signal RESET_s is enabled.

Referring to FIGS. 1 and 3, the reset signal generator 130 may enable the reset signal RESET_s for a preset time when the chip enable signal CEN is disabled and both the command latch enable signal CLE and the address latch enable signal ALE are enabled. That is, the operation of the reset signal generator 130 may be the same as that in the non-test described above.

Referring to FIG. 1, the enable signal generator 140 may disable the ODT enable signal ODT_en which has been maintained in the enabled state when the reset signal RESET_s is enabled.

The timing that the ODT enable signal ODT_en is generated in the test (i.e., test mode, when the test signal is enabled to the high level) will be described with reference to FIG. 4. In an embodiment, it should be noted that a non-test or non-test mode may be when the test signal is disabled to a low level. When the chip enable signal CEN is enabled to the low level and both the command latch enable signal CLE and the address latch enable signal ALE are disabled to the low level, the set signal SET_s may be enabled for a preset time. When the set signal SET_s is enabled, the ODT enable signal ODT_en may be enabled. When the chip enable signal CEN is disabled to the high level and both the command latch enable signal CLE and the address latch enable signal ALE are enabled to the high level, the reset signal RESET_s may be enabled for a preset time. When the reset signal RESET_s is enabled to the high level, the ODT enable signal ODT_en may be disabled.

The ODT circuit 200 may perform the ODT operation in the enable period of the ODT enable signal ODT_en.

In a semiconductor apparatus according to an embodiment, when the command CMD is determined as a command for activating the ODT circuit 200 in the test, the ODT circuit 200 may perform the ODT operation in response to the command latch enable signal CLE and the address latch enable signal ALE. When the chip enable signal CEN is disabled and the command latch enable signal CLE and the address latch enable signal ALE are enabled, the ODT operation of the ODT circuit 200 may be interrupted.

Accordingly, the semiconductor apparatus according to an embodiment may perform the ODT operation in response to the data strobe signal DQS in the non-test, and may perform the ODT operation in response to the command latch enable signal CLE and the address latch enable signal ALE in the test. The semiconductor apparatus according to an embodiment may perform the ODT operation in response to the chip enable signal CEN, the command latch enable signal CLE, and the address latch enable signal ALE in the test and the non-test.

The semiconductor apparatus according to an embodiment may select the method of performing the ODT operation using the data strobe signal which is used only when the data is input to the semiconductor apparatus and the method of performing the ODT operation using the command latch enable signal and the address latch enable signal which are used to interrupt the ODT operation. Accordingly, the start and termination of the ODT operation may be controlled using the command latch enable signal and the address latch enable signal in the test.

Figure 5:
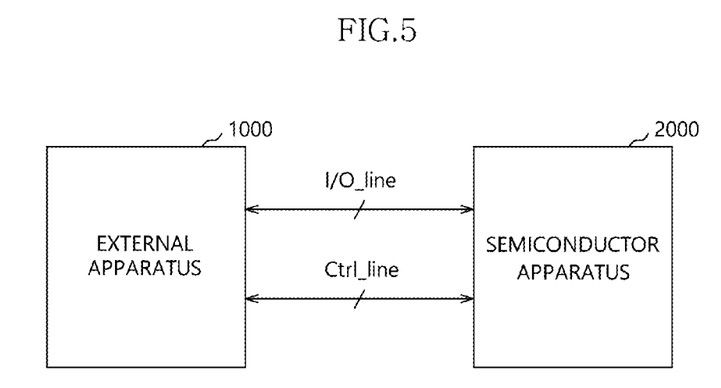
FIG. 5 is a diagram illustrating a representation of an example of a configuration of a semiconductor system according to an embodiment.

Referring to FIG. 5, a semiconductor system according to an embodiment may include an external apparatus 1000 and a semiconductor apparatus 2000.

The external apparatus 1000 and the semiconductor apparatus 2000 may be coupled through a plurality of I/O (input/output) signal lines I/O_line and a plurality of control signal lines Ctrl_line.

The plurality of control signal lines Ctrl_line may be signal lines configured for transferring the command latch enable signal (see CLE of FIG. 1), the address latch enable signal (see ALE of FIG. 1), the data strobe signal (see DQS of FIG. 1), and the mode control signal (see TEST of FIG. 1).

The plurality of I/O signal lines I/O_line may be signal lines configured for transferring an address, a command, and data.

The external apparatus 1000 may be an apparatus capable of controlling the semiconductor apparatus 2000, and may include a controller or a test apparatus.

The semiconductor apparatus 2000 may, in response to the mode control signal TEST, perform an ODT operation according to the data strobe signal DQS or perform the ODT operation according to the command latch enable signal CLE and the address latch enable signal ALE. For example, when the mode control signal TEST is disabled, the semiconductor apparatus 2000 may perform the ODT operation in response to the data strobe signal DQS, and when the mode control signal TEST is enabled, the semiconductor apparatus 2000 may perform the ODT operation in response to the command latch enable signal CLE and the address latch enable signal ALE.

When the command latch enable signal CLE is enabled, the semiconductor apparatus 2000 may determine a signal input to the plurality of I/O signal lines I/O_line as a command, and when the address latch enable signal ALE is enabled, the semiconductor apparatus 2000 may determine the signal input to the plurality of I/O signal lines I/O_line as an address.

The semiconductor apparatus 2000 may include an ODT enable signal generator 100 and the ODT circuit 200 as illustrated in FIG. 1.

When the mode control signal TEST is disabled, the ODT enable signal generator 100 may enable the ODT enable signal ODT_en in response to the data strobe signal DQS, and when the mode control signal TEST is enabled, the ODT enable signal generator 100 may enable the ODT enable signal ODT_en in response to the command latch enable signal CLE and the address latch enable signal ALE.

The ODT circuit 200 may perform the ODT operation in response to the ODT enable signal ODT_en.

Figure 4:
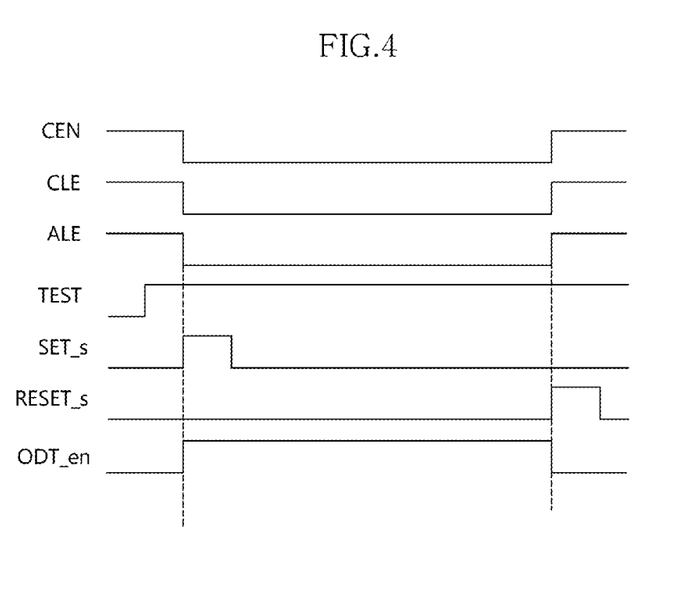
FIG. 4 is a timing diagram explaining a representation of an example of an operation of a semiconductor apparatus according to an embodiment.

The ODT enable signal generator 100 may be configured as illustrated in FIGS. 2 to 4, and the ODT enable signal generator 100 having the configuration has been described with reference to FIGS. 2 to 4 and thus the description thereof will be omitted.

The operation of the semiconductor system according to an embodiment will be described below.

The external apparatus 1000 may provide the mode control signal TEST and the data strobe signal DQS to the semiconductor apparatus 2000 through the plurality of control signal lines Ctrl_line.

The mode control signal TEST may be in a disabled state, and the semiconductor apparatus 2000 may perform the ODT operation in response to the data strobe signal DQS.

The external apparatus 1000 may provide the mode control signal TEST, the command latch enable signal CLE, and the address latch enable signal ALE to the semiconductor apparatus 2000 through the plurality of control signal lines Ctrl_line.

The mode control signal TEST may be in an enable state, and the semiconductor apparatus 2000 may perform the ODT operation in response to the command latch enable signal CLE and the address latch enable signal ALE.

The semiconductor apparatus 2000 may include the ODT enable signal generator 100 and the ODT circuit 200 as illustrated in FIG. 1, and may be operated as described with reference to FIGS. 1 to 4.

Accordingly, the semiconductor apparatus and the semiconductor system according to embodiments may perform the ODT operation in response to the data strobe signal in a specific mode, and may perform the ODT operation in response to the command latch enable signal and the address latch enable signal in another specific mode.

The above embodiments are illustrative and not limitative. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor apparatus comprising:
    an on-die termination (ODT) enable signal generator configured to enable an ODT enable signal in response to a data strobe signal, or enable the ODT enable signal in response to a command latch enable signal and an address latch enable signal; and
    an ODT circuit configured to perform an ODT operation in response to the ODT enable signal,
    wherein the ODT enable signal generator enables the ODT enable signal in response to the data strobe signal in a non-test and enables the ODT enable signal in response to the command latch enable signal and the address latch enable signal in a test.

2. The semiconductor apparatus of claim 1, wherein the ODT enable signal generator disables the ODT enable signal in response to a chip enable signal, the command latch enable signal, and the address latch enable signal.

3. The semiconductor apparatus of claim 2, wherein the ODT enable signal generator includes:
    a set signal generator configured to generate a set signal in response to the data strobe signal, the command latch enable signal, the address latch enable signal, and a test signal;
    a reset signal generator configured to generate a reset signal in response to the chip enable signal, the command latch enable signal, and the address latch enable signal; and
    an enable signal generator configured to enable the ODT enable signal in response to the set signal or disable the ODT enable signal in response to the reset signal.

4. The semiconductor apparatus of claim 3, wherein the set signal generator outputs the data strobe signal as the set signal when the test signal is disabled, and generates the set signal in response to the command latch enable signal and the address latch enable signal when the test signal is enabled.

5. The semiconductor apparatus of claim 4, wherein the set signal generator includes:
    a set signal enable determination unit configured to enable a set determination signal when both the command latch enable signal and the address latch enable signal are disabled;
    a pulse generator configured to generate a pulse enabled for a preset time when the set determination signal is enabled; and
    a selection output unit configured to output one of the generated pulse and the data strobe signal as the set signal in response to the test signal.

6. The semiconductor apparatus of claim 3, wherein the reset signal generator generates the reset signal enabled for a preset time when the chip enable signal is disabled and the command latch enable signal and the address latch enable signal are enabled.

7. The semiconductor apparatus of claim 6, wherein the reset signal generator includes:
    a reset signal enable determination unit configured to enable a reset determination signal when the chip enable signal is disabled and the command latch enable signal and the address latch enable signal are enabled; and
    a pulse generator configured to generate a pulse enabled for a preset time when the reset determination signal is enabled and output the generated pulse as the reset signal.

8. A semiconductor apparatus comprising:
    an activation determination unit configured to generate an activation determination signal in response to a command;
    a set signal generator configured to, in response to a test signal, generate a set signal according to a data strobe signal or generate the set signal according to a command latch enable signal and an address latch enable signal;
    a reset signal generator configured to generate a reset signal in response to a chip enable signal, the command latch enable signal, and the address latch enable signal;
    an enable signal generator configured to generate an on-die termination (ODT) enable signal in response to the activation determination signal, the set signal, and the reset signal; and
    an ODT circuit configured to perform an ODT operation in response to the ODT enable signal.

9. The semiconductor apparatus of claim 8, wherein the activation determination unit enables the activation determination signal when the command is a command for causing the ODT operation to be performed.

10. The semiconductor apparatus of claim 8, wherein the set signal generator outputs the data strobe signal as the set signal when the test signal is disabled, and
    the set signal generator enables the set signal for a preset time when the command latch enable signal and the address latch enable signal are disabled in a state that the test signal is enabled.

11. The semiconductor apparatus of claim 8, wherein the reset signal generator enables the reset signal for a preset time when the chip enable signal is disabled and the command latch enable signal and the address latch enable signal are enabled.

12. The semiconductor apparatus of claim 8, wherein the enable signal generator enables the ODT enable signal when the set signal is enabled in a state that the activation determination signal is enabled and disables the ODT enable signal when the reset signal is enabled.

13. A semiconductor system comprising:
an external apparatus; and
a semiconductor apparatus coupled to the external apparatus through a plurality of input/output (I/O) signal lines and a plurality of control signal lines,
wherein the plurality of control signal lines are signal lines for transferring a command latch enable signal, an address latch enable signal, a data strobe signal, and a mode control signal,
the plurality of input/output (I/O) signal lines are signal lines for transferring an address, a command, and data, and
the semiconductor apparatus performs the ODT operation in response to the data strobe signal when the mode control signal is disabled, and performs the ODT operation in response to the command latch enable signal and the address latch enable signal when the mode control signal is enabled,
wherein the mode control signal is disabled in a non-test and the mode control signal is enabled in a test.

14. The semiconductor system of claim 13, wherein the semiconductor apparatus includes:
an ODT enable signal generator configured to enable the ODT enable signal in response to the data strobe signal when the mode control signal is disabled, and enables the ODT enable signal in response to the command latch enable signal and the address latch enable signal when the mode control signal is enabled; and
an ODT circuit configured to perform the ODT operation in response to the ODT enable signal.

15. The semiconductor system of claim 13, wherein the semiconductor apparatus determines a signal input to the plurality of I/O signal lines as the command when the command enable latch signal is enabled, determines a signal input to the plurality of I/O signal lines as an address when the address enable latch signal is enabled, and determines a signal input to the plurality of I/O signal lines as data when the command enable latch signal and the address latch enable signal are disabled.

16. The semiconductor system of claim 13, wherein the external apparatus is an apparatus configured to control an operation of the semiconductor apparatus.

\* \* \* \* \*